United States Patent
Wei et al.

(10) Patent No.: US 10,537,030 B2
(45) Date of Patent: Jan. 14, 2020

(54) VOIDING CONTROL USING SOLID SOLDER PREFORMS EMBEDDED IN SOLDER PASTE

(71) Applicant: Indium Corporation, Clinton, NY (US)

(72) Inventors: Zhenxi Wei, Shenzhen (CN); Lei Luo, Shenzhen (CN); Christopher John Nash, Barneveld, NY (US); Derrick Matthew Herron, Canastota, NY (US)

(73) Assignee: INDIUM CORPORATION, Clinton, NY (US)

( * ) Notice: Subject to any disclaimer, the term of this patent is extended or adjusted under 35 U.S.C. 154(b) by 568 days.

(21) Appl. No.: 14/833,398

(22) Filed: Aug. 24, 2015

(65) Prior Publication Data
US 2016/0057869 A1 Feb. 25, 2016

Related U.S. Application Data

(60) Provisional application No. 62/041,233, filed on Aug. 25, 2014.

(51) Int. Cl.
*H05K 3/34* (2006.01)
*H01L 21/48* (2006.01)

(52) U.S. Cl.
CPC ....... *H05K 3/3484* (2013.01); *H01L 21/4853* (2013.01); *H05K 3/3478* (2013.01);
(Continued)

(58) Field of Classification Search
CPC .. H05K 3/3484; H05K 3/3478; H05K 3/3494; H05K 3/3436; H05K 2203/0182;
(Continued)

(56) References Cited

U.S. PATENT DOCUMENTS

| 5,709,338 A * | 1/1998 | Shirai | B23K 1/0016 |
| | | | 228/226 |
| 2005/0184129 A1* | 8/2005 | Godijn | H05K 3/3478 |
| | | | 228/56.3 |

(Continued)

FOREIGN PATENT DOCUMENTS

WO 2013049061 4/2013

OTHER PUBLICATIONS

Chinese Office Action in Chinese Application No. 2015106439322, dated Dec. 24, 2018, 20 pages.
(Continued)

*Primary Examiner* — Peter Dungba Vo
*Assistant Examiner* — Azm Parvez
(74) *Attorney, Agent, or Firm* — Sheppard, Mullin, Richter & Hampton LLP

(57) ABSTRACT

Methods are provided for controlling voiding caused by gasses in solder joints of electronic assemblies. In various embodiments, a preform can be embedded into the solder paste prior to the component placement. The solder preform can be configured with a geometry such that it creates a standoff, or gap, between the components to be mounted in the solder paste. The method includes receiving a printed circuit board comprising a plurality of contact pads; depositing a volume of solder paste onto each of the plurality of contact pads; depositing a solder preform into each volume of solder paste; placing electronic components onto the printed circuit board such that contacts of the electronic components are aligned with corresponding contact pads of the printed circuit board; and reflow soldering the electronic components to the printed circuit board.

18 Claims, 16 Drawing Sheets

(52) U.S. Cl.
CPC ......... *H05K 3/3494* (2013.01); *H05K 3/3436* (2013.01); *H05K 2203/0182* (2013.01); *H05K 2203/047* (2013.01); *H05K 2203/0415* (2013.01); *H05K 2203/1178* (2013.01); *Y10T 29/49144* (2015.01)

(58) Field of Classification Search
CPC ..... H05K 2203/0415; H05K 2203/047; H05K 2203/1178; H01L 21/4853; Y10T 29/49144; Y10T 29/4913; Y10T 29/49124; Y10T 29/49117; Y10T 29/49002
USPC ........................ 29/840, 832, 829, 825, 592.1
See application file for complete search history.

(56) References Cited

U.S. PATENT DOCUMENTS

2008/0118761 A1* 5/2008 Weiser ................... B23K 35/26
428/457
2009/0236725 A1* 9/2009 Hirano ................ B23K 35/262
257/690
2014/0328039 A1* 11/2014 Koep ................... H05K 3/3421
361/767

OTHER PUBLICATIONS

Office Action dated Aug. 14, 2019 for Chinese Application No. 2015106439322.

* cited by examiner

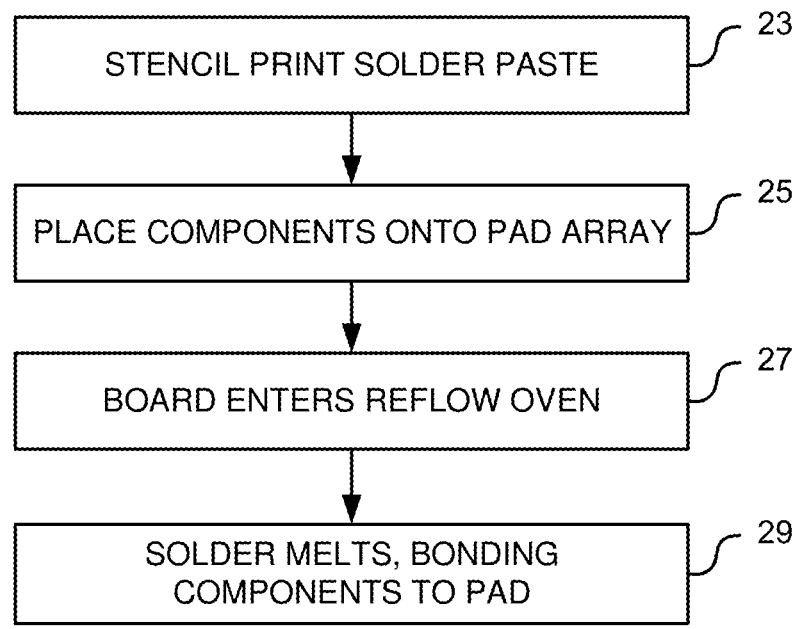
Fig. 1
(CONVENTIONAL)

0201 Preform

0402 Preform

Percent Voiding

| Board # | QFN # | Indium10.1 | Indium10.1 1x 0201 | Indium10.1 2x 0201 | Indium10.1 1x 0402 | Indium10.1 2x 0402 |
|---|---|---|---|---|---|---|
| Board 1 | QFN 1 | 11.0684 | 18.0936 | 12.6779 | 14.2929 | 12.0061 |
| | QFN 2 | 10.4485 | 14.8698 | 17.6401 | 17.5541 | 13.1225 |
| | QFN 3 | 19.3415 | 16.4245 | 18.6684 | 9.8739 | 11.8117 |
| | QFN 4 | 26.9677 | 19.6949 | 13.7903 | 14.1263 | 9.1949 |
| | QFN 5 | 14.8346 | 16.1684 | 16.3224 | 9.7555 | 9.3272 |
| | QFN 6 | 26.3062 | 19.7813 | 16.8232 | 10.8801 | 10.3561 |
| | QFN 7 | 4.8614 | 21.7609 | 16.9244 | 13.3670 | 12.8156 |
| | QFN 8 | 13.4741 | 16.5366 | 11.9036 | 10.2683 | 8.6686 |
| | QFN 9 | 3.7856 | 16.7953 | 14.1243 | 13.2679 | 10.4306 |
| | QFN 10 | 30.6558 | 27.7021 | 17.2797 | 14.3164 | 11.1750 |
| | QFN 11 | 19.5293 | 24.9708 | 18.4465 | 15.3586 | 12.9836 |
| | QFN 12 | 18.1431 | 16.4169 | 17.7964 | 7.7197 | 9.4501 |
| Board 2 | QFN 1 | 9.5772 | 17.4723 | 12.6529 | 17.3802 | 12.8730 |
| | QFN 2 | 25.2542 | 15.2252 | 19.5666 | 19.4984 | 10.3052 |
| | QFN 3 | 19.6313 | 15.8184 | 16.2023 | 20.0641 | 9.7344 |
| | QFN 4 | 27.4168 | 17.8488 | 15.2392 | 11.6191 | 12.0032 |
| | QFN 5 | 12.8684 | 13.4010 | 12.2457 | 9.8793 | 12.8215 |
| | QFN 6 | 30.8757 | 14.1091 | 15.2057 | 13.8200 | 14.5770 |
| | QFN 7 | 20.8430 | 13.8430 | 13.7918 | 11.3682 | 10.9792 |
| | QFN 8 | 12.9048 | 18.7531 | 14.6443 | 12.4078 | 16.7882 |
| | QFN 9 | 21.2738 | 12.8350 | 16.6939 | 13.2817 | 15.0639 |
| | QFN 10 | 12.4742 | 12.9818 | 10.4445 | 13.6500 | 18.6562 |
| | QFN 11 | 13.7851 | 20.6097 | 16.6699 | 16.4012 | 12.9410 |
| | QFN 12 | 20.1350 | 14.1508 | 13.9637 | 10.1139 | 12.3975 |
| | AVERAGE | 17.7658 | 17.3443 | 15.4071 | 13.3007 | 12.1059 |
| | Post Reflow Skewing: | 0 Skewed | 5 Skewed | 0 Skewed | 3 Skewed | 0 Skewed |

Fig. 5

Indium 10.1

Indium10.1 with 1 x 0201 Images

Indium10.1 with 2x 0201 Images

Indium10.1 with 1x 0402 Images

Indium10.1 with 2x 0402 Images

VOIDING CONTROL USING SOLID SOLDER PREFORMS EMBEDDED IN SOLDER PASTE

CROSS-REFERENCE TO RELATED APPLICATIONS

This application claims the benefit of U.S. Provisional Patent Application No. 62/041,233 filed Aug. 25, 2014, which is incorporated herein by reference in its entirety.

TECHNICAL FIELD

The disclosed technology relates generally to solder technology, and more particularly, some embodiments relate to voiding control using solder preforms.

DESCRIPTION OF THE RELATED ART

Electronic assemblies generally include one or more circuit boards onto which electronic components are mounted. Each bare circuit board is generally made up of multiple layers (2 or more) with electrical interconnections patterned on the layers. The interconnections terminate in pads or other contacts on the surface of the circuit board onto which corresponding pads of the electronic components are soldered. Semiconductors and other active and passive components, for example, are bonded to the pads on the circuit board by solder, which provides both mechanical bonding and allows electrical connections from each component to the pad interconnections on the circuit board.

Solder paste is the common physical form of solder used to bond the various components to the pads on the circuit board. Solder paste is generally comprised of low-oxide, pre-alloyed solder powder of specific size range, mixed with a flux vehicle. The solder-powder composition portion of the solder paste can be an alloy and typically comprises, for example, tin-lead, tin-lead-silver, or any of the common lead-free solder alloys such as, for example, tin-silver-copper, tin-silver-bismuth, tin-bismuth, or tin-indium.

The flux vehicle portion of the solder paste generally includes rosin or resin polymer, one or more solvents, one or more flux chemicals, stabilizers, rheological control additives, preservatives and wetting agents. Normally the flux vehicle is present in the solder paste in an amount greater than necessary for wetting each component lead to its corresponding pad. The excess quantity of flux vehicle is included to achieve the proper rheology to stencil print the paste onto a circuit board, and to provide enough "tack" to temporarily hold the component in place prior to solder reflow.

FIG. 1 is a diagram illustrating an example process for bonding the various components to the circuit board. At operation 23, Solder paste is stencil printed onto the metallization pads of the circuit board. At operation 25, each component is placed onto a specific geometrically spaced pad array. This can be done automatically, for example, using robotic equipment. The tacky nature of the solder paste, as mentioned above, temporarily holds the component in place prior to solder reflow.

At operation 27, the circuit board enters a conveyor reflow oven that includes several regulated temperature zones. A predetermined temperature profile designed for a specific circuit board insures that the solvent is carefully evaporated, the fluxes activated, and the solder melts and wets both the component metallization pads and corresponding pads on the circuit board. Thus, in the oven, at operation 29, the solder powder in the paste is melted and forms a solid mass, bonding the components to their respective metallization pads on the circuit board.

During the reflow process, gasses are released from the evaporation of the solvents, resin and fluxes. Most of these gasses are expelled to the side of the pad and component terminations, but some gas becomes trapped in the solder joint resulting in voids. Excess solder voiding reduces the physical bonding strength of component to pad, and reduces both electrical and thermal conductivity. This voiding results in reduced reliability of the circuit board and thus the electronic assembly. Solder voiding can easily be observed and quantified using X-ray instrumentation.

In small to medium sized pads, solder voiding is usually controlled by proper paste formulation chemistry, reflow profile parameters, pad design and stencil design. However voiding becomes more problematic as the pad area and component termination areas increase such as in the use of bottom termination component semiconductor packages such as, for example, Quad Flat No-leads packages (QFNs). The use of QFNs is increasing due to the growth of MOSFET and IGBT devices. With the larger pad and component termination area, higher solder voiding occurs due to the trapped gasses than cannot escape the confines of the large area pad and parallel termination on the QFN package.

BRIEF SUMMARY OF EMBODIMENTS

The present disclosure provides methods for controlling voiding caused by trapped gasses in solder joints of electronic assemblies. In various embodiments, a preform can be embedded into the solder paste prior to the component placement. The solder preform can be configured with a geometry such that it creates a standoff, or gap, between the components to be mounted in the solder paste.

In one embodiment, the method includes receiving a printed circuit board comprising a plurality of contact pads; depositing a volume of solder paste onto each of the plurality of contact pads; depositing a solder preform into each volume of solder paste; placing electronic components onto the printed circuit board such that contacts of the electronic components are aligned with corresponding contact pads of the printed circuit board; and reflow soldering the electronic components to the printed circuit board.

In implementations of this embodiment, the preform maintains a gap between the component and the solder paste during reflow soldering such that at least some of the gasses created as a byproduct of the solder paste melting may escape from between the contacts.

In embodiments, the solder preform has substantially the same melting temperature or a higher melting temperature than the solder paste. In additional embodiments, two or more solder preforms may be deposited in each volume of solder paste. In particular implementations of these embodiments, the preforms may include 0201 or 0402 preforms as described in the disclosure. In further implementations, the solder preforms are the same or substantially the same height as the corresponding volumes of solder paste into which they are placed.

In further embodiments, the electronic components comprise a bottom termination component semiconductor package such as a QFN package.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Some of the figures included herein illustrate various embodiments of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

FIG. 1 is an operational flow diagram illustrating an example process for bonding electrical components to a circuit board.

FIG. 5 is a table summarizing the results for testing of 12 different Quad Flat No-leads packages (QFNs) on two boards using a solder paste in five configurations: without a preform, with one 0201 preform, with two 0201 preforms, with one 0402 preform, and with two 0402 preforms.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the disclosed technology can be implemented to provide a solution to issues caused by outgassing. In various embodiments, a preform can be embedded into the solder paste prior to the component placement. The solder preform can be configured with a geometry such that it creates a standoff, or gap, between the components to be mounted in the solder paste. Preferably, the preform is configured to also have a geometry such that it provides an opening or channel through which gases created as a byproduct of the solder and operation can escape from beneath the component being soldered.

In various embodiments, the solder preform has the same, or substantially the same, alloy composition as the solder alloy composition of the solder paste. This can allow reflow at the same temperature. In other embodiments, the solder preform can have an alloy composition that has a lower or higher melting point than that of the solder paste. Having a higher melting point, for example, may allow the preform to maintain the gap as the paste begins to melt and release gasses. In some embodiments, the preform can have a melting point that is 1-5% or 5-10% higher than that of the solder paste. In other embodiments, the preform can have a melting point that is 0.1-1% higher than that of the solder paste.

In various embodiments, tests have shown that solder voiding may be reduced from approximately 45% using solder paste alone to approximately 10% using one or more preforms embedded in paste, depending on the chemistry and configuration.

Figure 2:
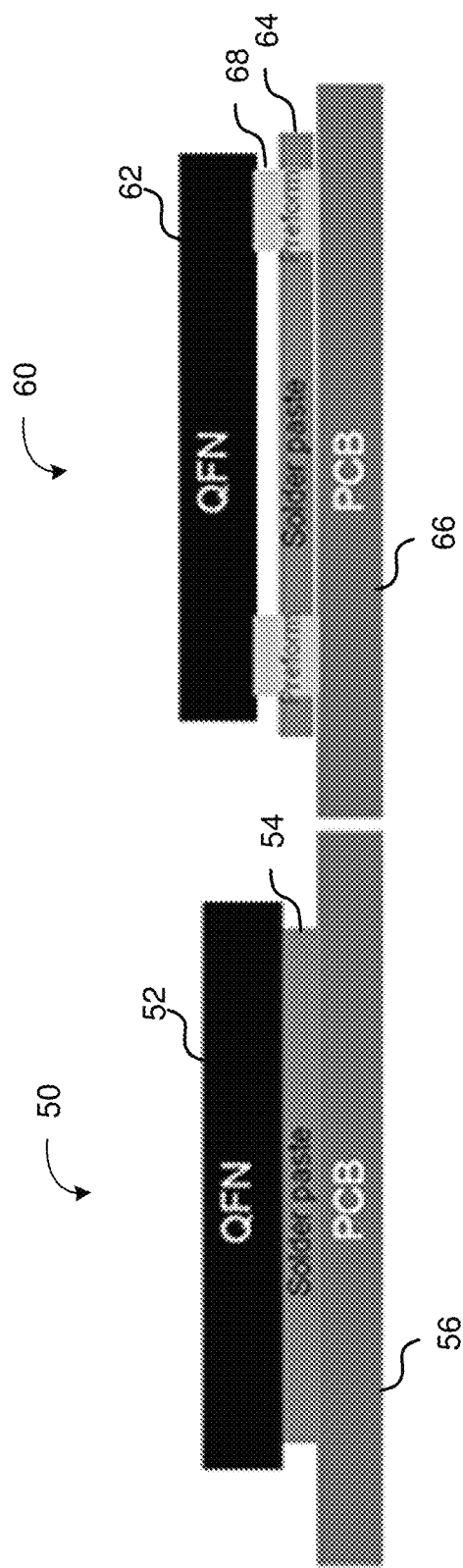
FIG. 2 illustrates a cross-sectional view of an example application of a solder preform embedded in a solder paste after component placement but prior to reflow operations.

FIG. 2 is a diagram illustrating a cross-sectional view of an example application of a solder preform embedded in a solder paste after component placement but prior to reflow operations. FIG. 2 also shows the conventional configuration 50 of a component mounted to the print circuit board using only the solder paste without a preform embedded therein. With reference now to FIG. 2, the left-hand side of the figure illustrates a conventional configuration 50 in which a component 52 (in this example, a QFN), is mounted to a printed circuit board (PCB) 56 using a solder paste 54. Solder paste 54 may be any of a number of different available solder pastes, including conventionally available solder pastes such as, for example, pastes comprising tin-lead, tin-lead-silver, tin-silver-copper, tin-silver-bismuth, tin-bismuth, or tin-indium, to name a few.

The right-hand side of FIG. 2 illustrates a configuration 60 using embedded preforms (two are shown). In this example, the preforms 68 are embedded in solder paste 64 prior to mounting the component 62 onto the printed circuit board 66. As can be seen from this example, preforms 68 have a higher profile than that presented by the solder paste 64 that has been printed or otherwise patterned onto print circuit board 66. As also seen from this example, this higher profile results in a gap between component 62 and solder paste 64. This forms a channel through which gases expelled from the solder paste 64 during reflow may escape and avoid being trapped between component 62 and printed circuit board 66. Although two preforms 68 are shown in the example of FIG. 2, in other embodiments, other quantities of preforms can be used. Preforms can be placed, for example, on the sides of the pad, at the corners of the pad, in the center of the pad, or at other locations.

Component 62, solder paste 64, and printed circuit board 66 can be the same or similar to the corresponding elements shown in the conventional configuration on the left-hand side of FIG. 2. However, after reading this description, one of ordinary skill in the art will understand that the embedded solder preform can be implemented using any of a number of different electronic components, solder paste alloys, and printed circuit board configurations.

Figure 3:
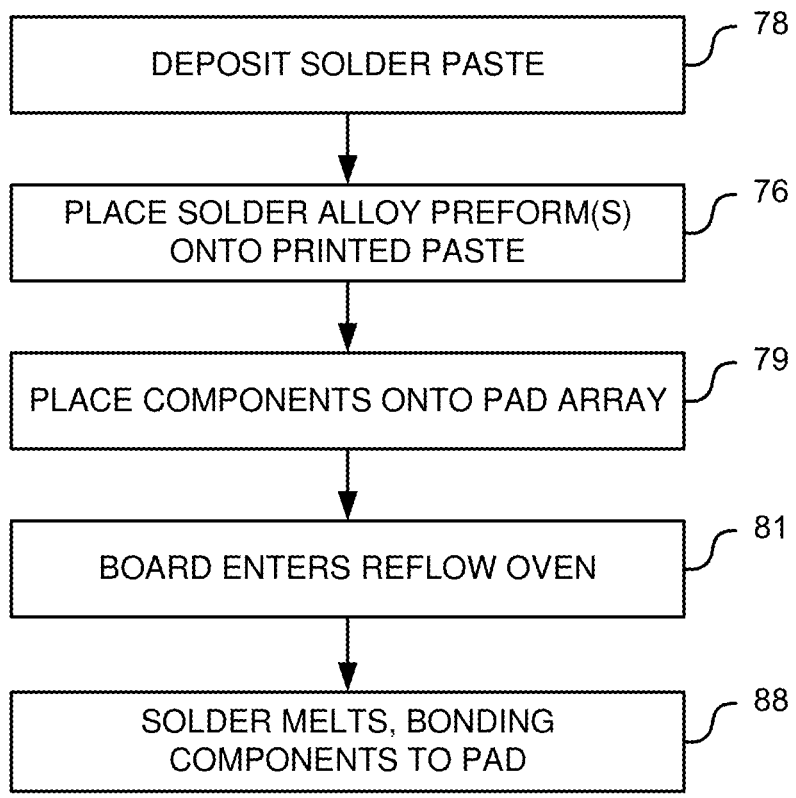
FIG. 3 is an operational flow diagram illustrating an example process for reflow operations using an embedded solder preform in accordance with one embodiment of the technology disclosed herein.

FIG. 3 is a diagram illustrating an example process for reflow operations using an embedded solder preform in accordance with one embodiment of the technology disclosed herein. With reference now to FIGS. 2 and 3, at operation 78 the solder paste is deposited onto the printed circuit board. In terms of the example illustrated in FIG. 2, solder paste 64 may be printed onto printed circuit board 66. However, in other embodiments, solder paste 64 may be patterned onto the printed circuit board using other techniques.

At operation 76, one or more solder alloy preforms are laid down on the printed circuit board. Particularly, the preforms may be deposited such that they are embedded in the solder paste that has been placed on the printed circuit board. In terms of the example of FIG. 2, one or more preforms 68 can be embedded into solder paste 64 at each pad. Preferably, as described above, the geometry of the preform can be such that it has a higher profile than that of the deposited solder paste. Accordingly, when the component is mounted onto the circuit board (at operation 79), a gap or channel can remain between the bottom surface of the component and the top surface of the solder paste. This can be seen in FIG. 2 in which there is an air gap between the bottom surface of component 62 and the top surface of solder paste 64. As described above, this channel or gap can provide a path by which expelled gases may escape and avoid being trapped either in the solder paste or between the solder paste and the pads on either the component or the printed circuit board.

While in some embodiments, the preforms can extend above the solder paste prior to reflow operations, this can present challenges for component placement and reflow as the top surface of the preform may not present a sufficiently "tacky" surface to sufficiently maintain placement of the components. Accordingly, in other embodiments, the preform is fully embedded in the solder paste prior to reflow operations, but as heating occurs, due to the presence of flux vehicles in the solder paste, the profile of the solder paste is reduced more quickly than is the height of the preform. Accordingly, the gap is formed during reflow operations allowing expelled gases to escape. This can be true even in configurations where the preform alloy is identical to the solder paste alloy due to the presence of the flux vehicle in the solder paste.

At operation 81, the board with the mounted components enters the reflow oven. At operation 88, the solder paste and the solder preform melt, bonding components to the pad. As noted above, in various embodiments, a channel or gap may be provided between the bottom of the component and the melting solder paste. As a result, gases created by the reflow operation are allowed to escape from beneath the component.

In various embodiments, solder alloy preforms are typically quite small to allow placement on the pads. Such small solid solder alloy preforms can be packaged in tape and reel configurations for ease of handling and automated (e.g., robotic) placement. As one example, preforms of the size 0.020" length×0.010" width×0.010" thickness may be temporarily inserted into plastic tape and coiled on reels for automated placement. Such a preform can be made using variant alloys like the Sn96.5Ag3.5Cu0.5 (SAC305) alloy. Such a preform can work well together with solder paste without any reflow parameter setting changes.

Figure 4:
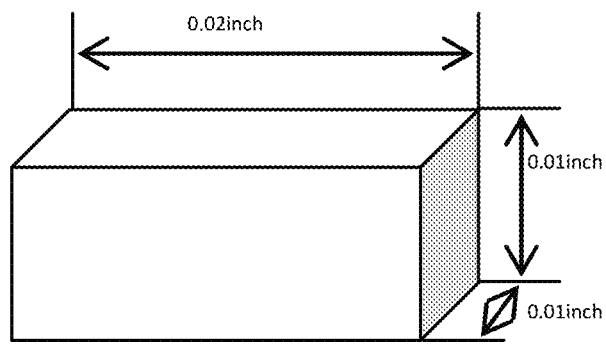
FIG. 4 is a diagram illustrating dimensions of example solder preforms that can be used in accordance with the technology disclosed herein.
Figure 4:
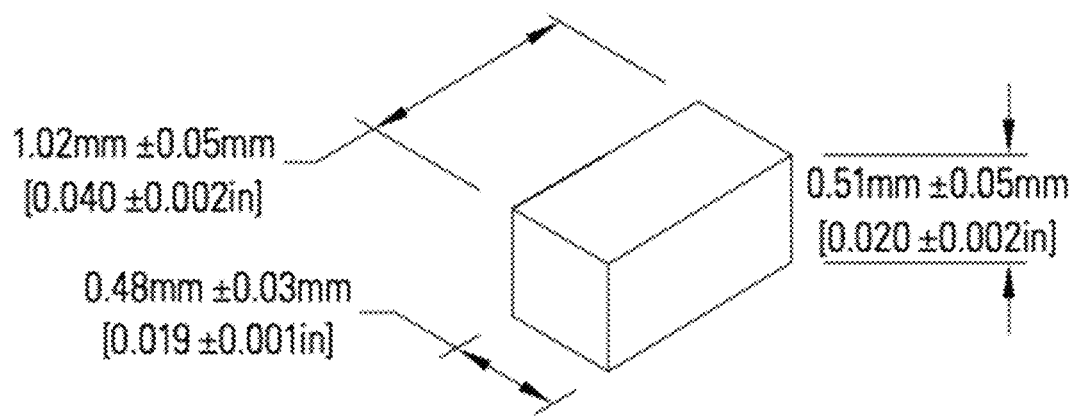

One size of conventionally available preform packaged into tape and reel is commonly referred to as 0201, available from Indium Corporation of Utica, N.Y. Another is the 0402 preform, available from Indium Corporation of Utica, N.Y. Also standard automation equipment is available to robotically deposit one or more preforms onto each pad previously deposited with solder paste. FIG. 4 is a diagram illustrating dimensions of example solder preforms that can be used in accordance with the technology disclosed herein. As this example illustrates, the 0201 preform is approximately 0.020" in length×0.010" in width×0.010" thick, and the 0402 preform is approximately 0.040" in length×0.019" in width× 0.020" thick.

As noted above, preforms can be configured in different shapes and sizes, and one or more preforms can be used on a given pad. Tests have shown that voiding decreases as the preform size increases, and that voiding decreases when more than one preform per pad is used. This may be due to the component standoff (i.e. the gap created) after the liquid's point of solder has been reached.

Tests have also shown that parameters such as maximum voiding, mean voiding, and minimum voiding all decreased with the use of a preform in one form or another. Results of these tests are now described. Tests were run using one preform per pad with placement in the dead center or centered on one side, and with two preforms positioned in opposite corners of the pad. Tests were run using two different preforms: the 0201 and 0402 preforms available from Indium Corporation. Tests showed that component (e.g., QFN) placement is not an issue if preforms are centered.

FIG. 5 is a diagram illustrating a summary of the test results using indium 10.1 solder paste, which is also available from the indium Corporation in Utica, N.Y. Particularly, FIG. 5 is a table summarizing the results for testing of 12 different QFNs on two boards using the 10.1 solder paste in five configurations: without a preform, with one 0201 preform, with two 0201 preforms, with one 0402 preform, and with two 0402 preforms. As this shows, the average percentage voiding decreases when one or more preforms are added. Particularly, using only indium 10.1 solder paste the average percentage of voiding is ~17.8%, with one 0201 preform the percentage drops by almost 0.5%, and with two 0201 preforms the percentage drops to ~15.4%. Using an Indium 0402 preform the percentage drops to ~13.3%, while using two 0402 preforms the percentage drops to ~12.1%. Also note, that with multiple preforms in this test, there was no post-reflow skewing. It is also noted that the results obtained with one or more preforms are more consistent than those obtained using the solder paste alone. This is further illustrated by figures summarizing the data, further described below.

Figure 6:
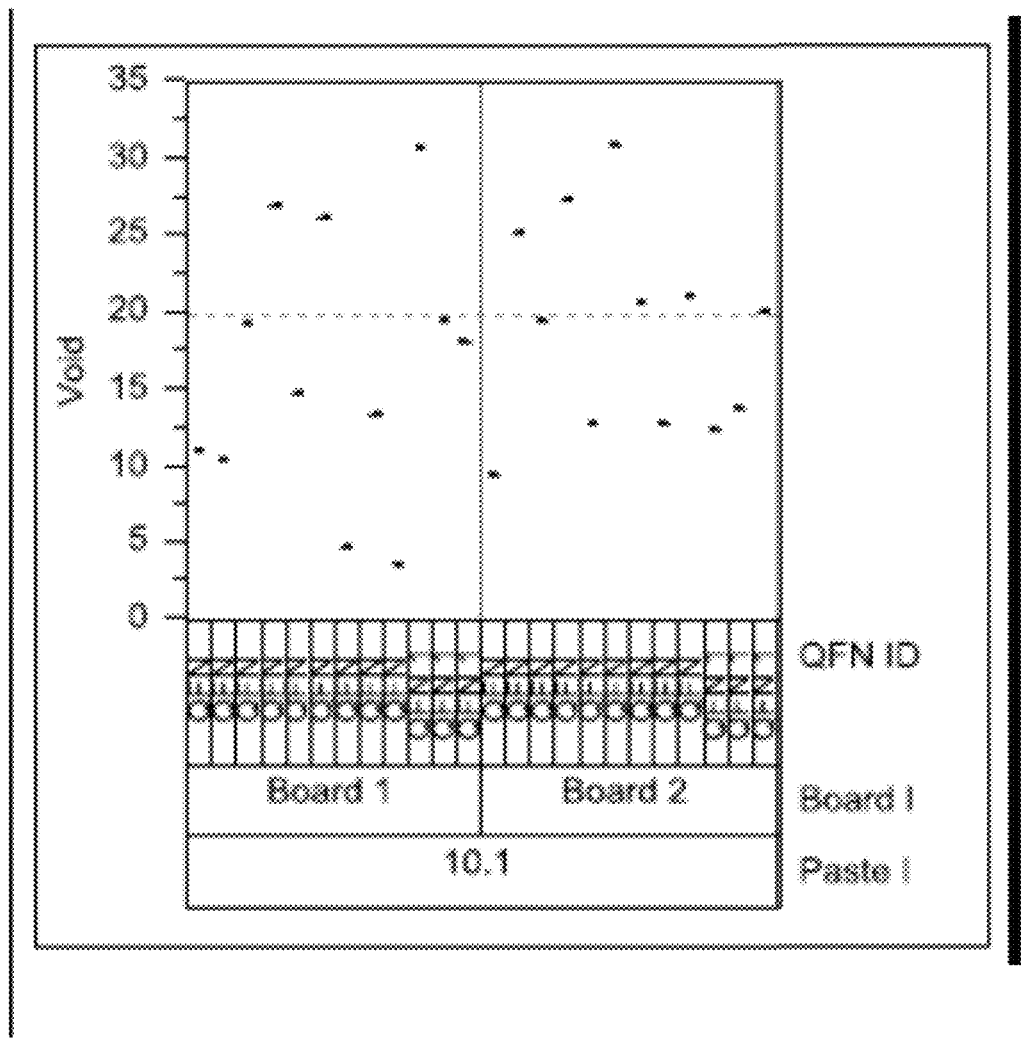
FIG. 6 is a diagram illustrating the variability in the void percentage for a test case using the solder paste of FIG. 5 with no preform.
Figure 7:
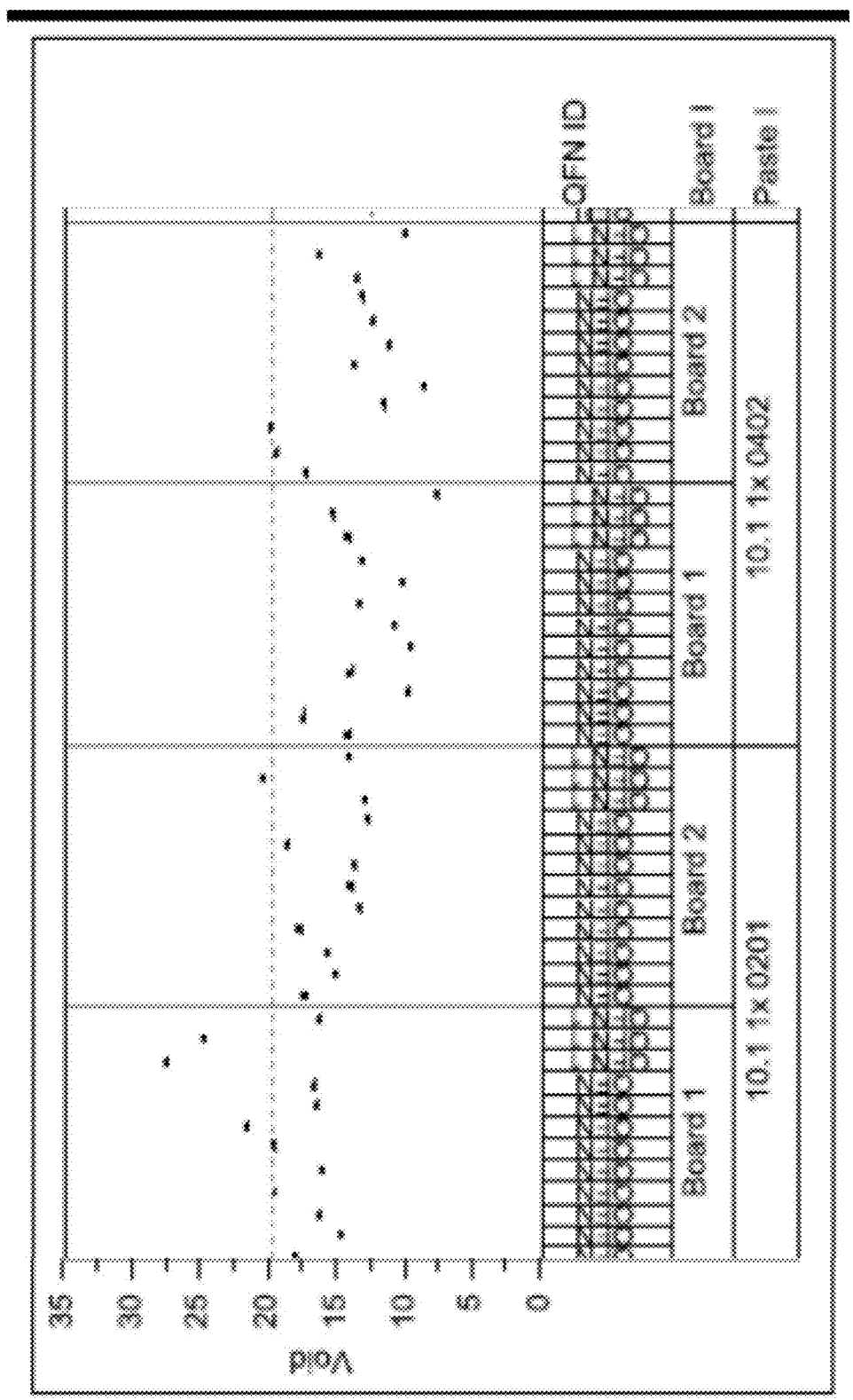
FIG. 7 is a diagram illustrating the variability in void percentage for a test case using the solder paste of FIG. 5 with either the 0201 preform or the 0402 preform.
Figure 8:
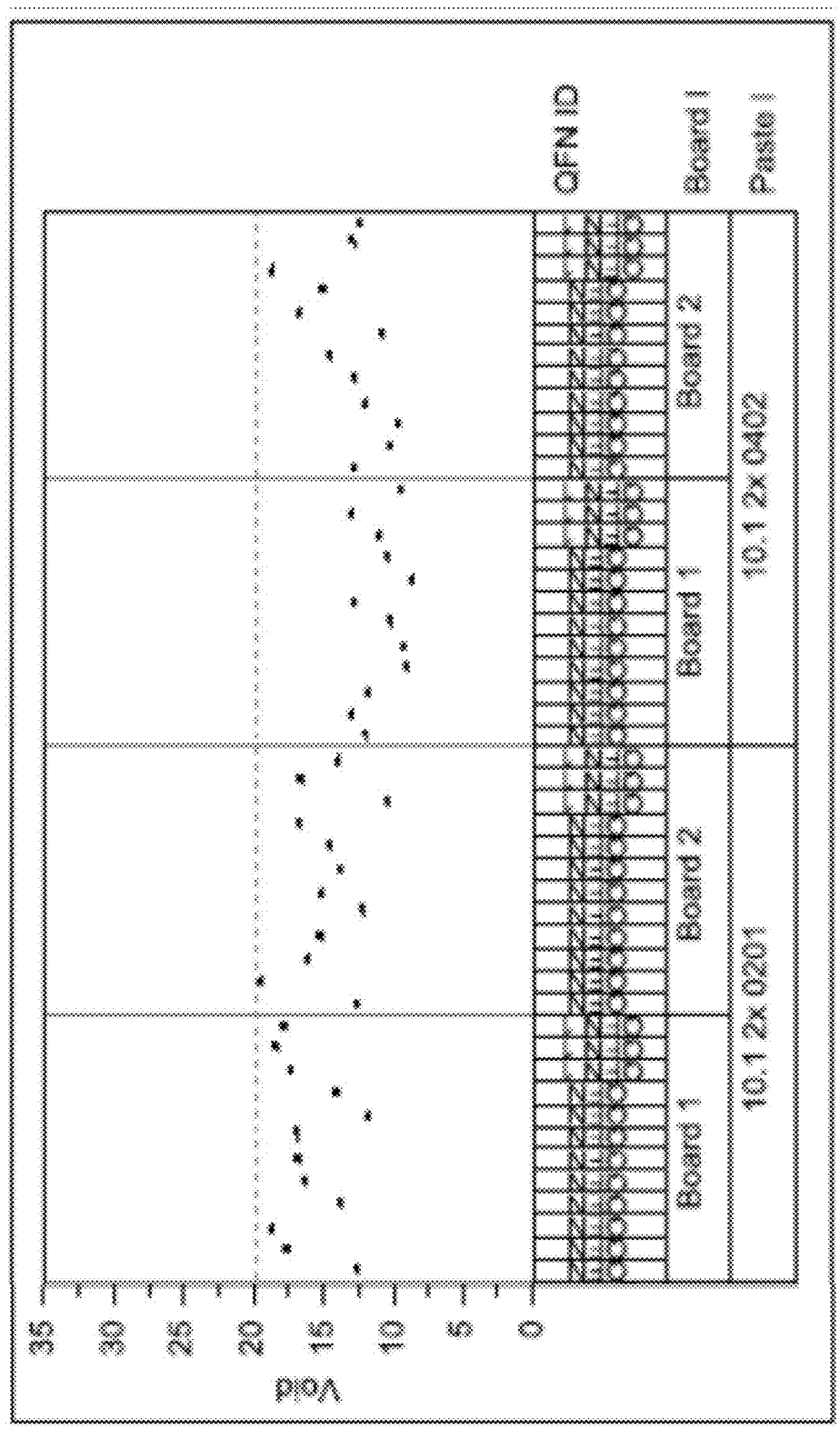
FIG. 8 is a diagram illustrating the variability in void percentage for a test case using the solder paste of FIG. 5 with two preforms, namely two 0201 preforms or two 0402 preforms.

FIGS. 6-12 are diagrams graphically illustrating the data listed in FIG. 5. Particularly, FIGS. 6, 7 and 8 are diagrams illustrating a variability chart for the void percentages achieved using none, one, or two solder preforms embedded in the solder paste. FIG. 6 is a diagram illustrating the variability in the voiding percent for a test case using 10.1 solder with no preform. As this chart illustrates, the sample sets across both boards show a high variability of voiding. While in some instances, the voiding is less than 5%, there are number of instances where the voiding is greater than 20%. As will be seen by examining the following figures, this is less consistent than test cases that used one or more preforms.

FIG. 7 is a diagram illustrating the variability in void percentage using one preform, either the 0201 preform or the 0402 preform. In comparison with the test results for the samples using no preform (FIG. 6), the void percentage in these cases is more consistent from test run to test run. This should provide more predictable results in practice. Additionally, there are very few runs in which the voiding exceeded 20% unlike the test case using no preform. It is also noted that test cases using the 0402 preform tended to exhibit a slightly lower percentage of voiding than did those using the 0201 preform.

FIG. 8 is a diagram illustrating the variability in void percentage using two preforms, namely two 0201 preforms or two 0402 preforms. As compared with both FIGS. 6 and 7, test runs using two preforms are even more consistent and show a further reduction in void percentage. In these results, there is only one sample that hit approximately 20%, and the rest ran below 20%. Although these results may not be what would conventionally be expected in the art, these results do indicate that a greater number of preforms per pad (e.g., four) may yield even better results. At some point, however, diminishing marginal returns are expected.

Figure 9:
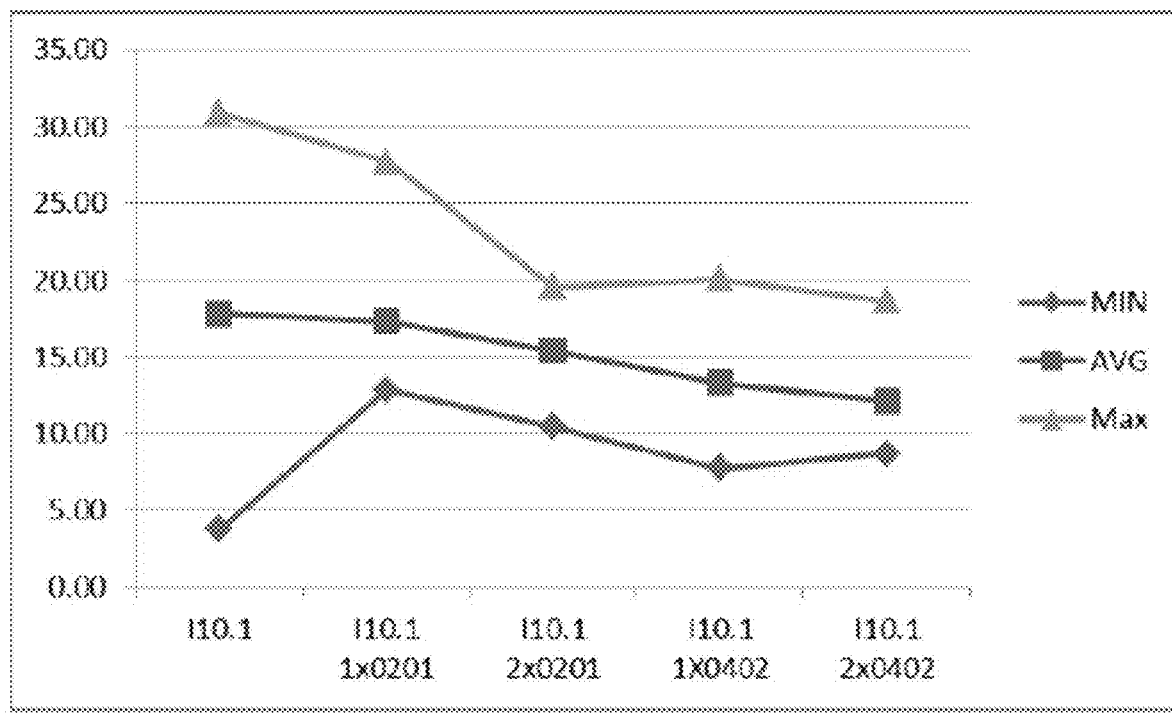
FIG. 9 is a diagram illustrating the minimum void percentage, average void percentage and maximum void percentage for each sample set of FIG. 5.

FIG. 9 is a diagram illustrating the minimum void percentage, average void percentage and maximum void percentage for each sample set. As this curve illustrates, in the sample set runs using only 10.1 solder paste with no preform, the spread between the minimum and maximum void percentages achieved is greater than that with sample sets using one or more preforms. Likewise, although this non-preform sample set did achieve the best results in some cases, it also achieved the worst results in other cases, and showed little or no predictability or consistency of results. As can be seen in the other sample sets using one or two preforms, the average void percentages tended to decrease with increasing number of preforms and with an increasing preform size. Likewise, the maximum and minimum void percentages for each of the sample sets using one or more preforms generally tended to decrease (with exceptions as seen in FIG. 9) as the quantity and size of the preform increased.

Figure 10:
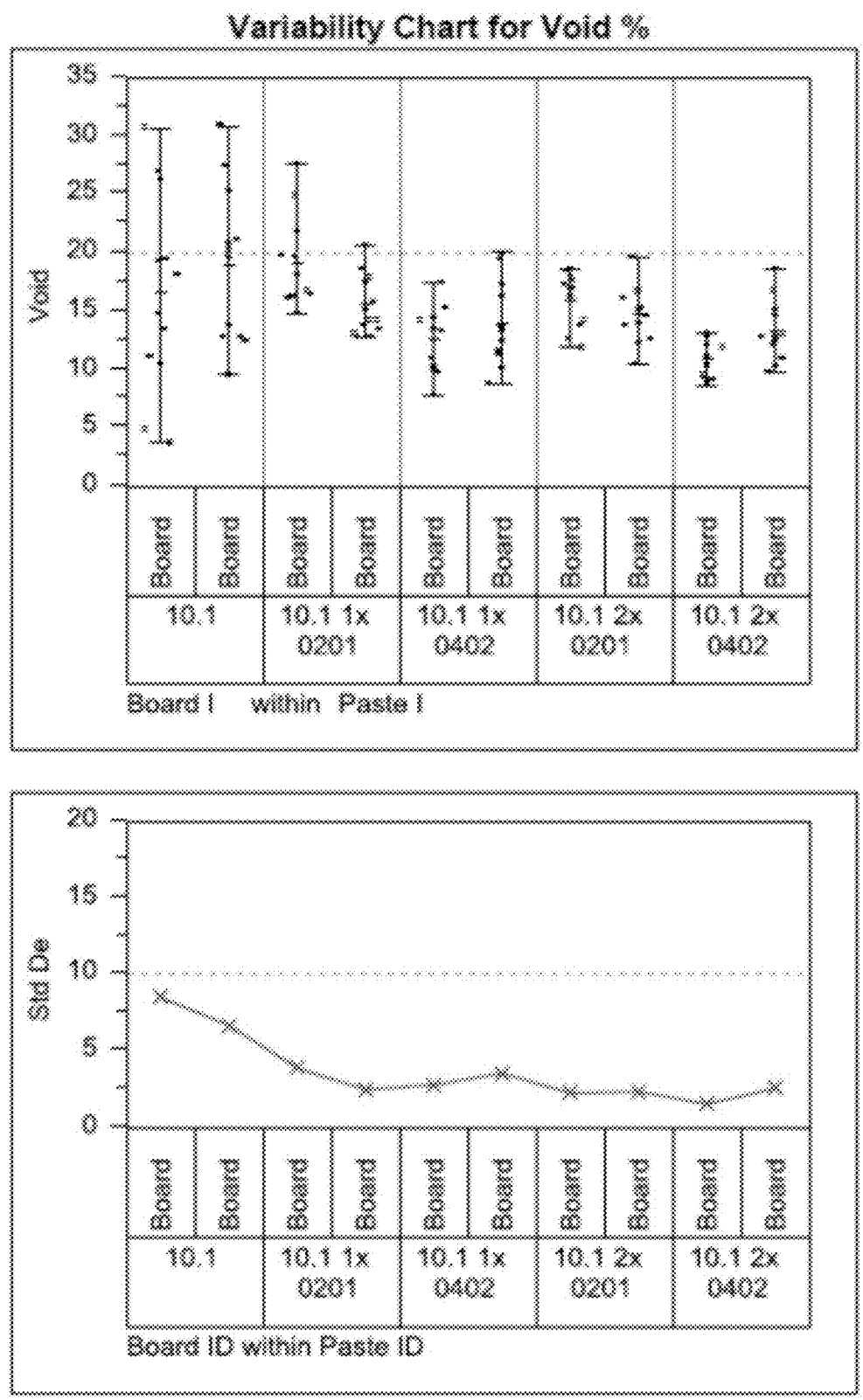
FIG. 10 is a diagram illustrating the variability of the void percentage for the sample sets of FIG. 5 (upper chart) and the standard deviation in the data points (lower chart).
Figure 11:
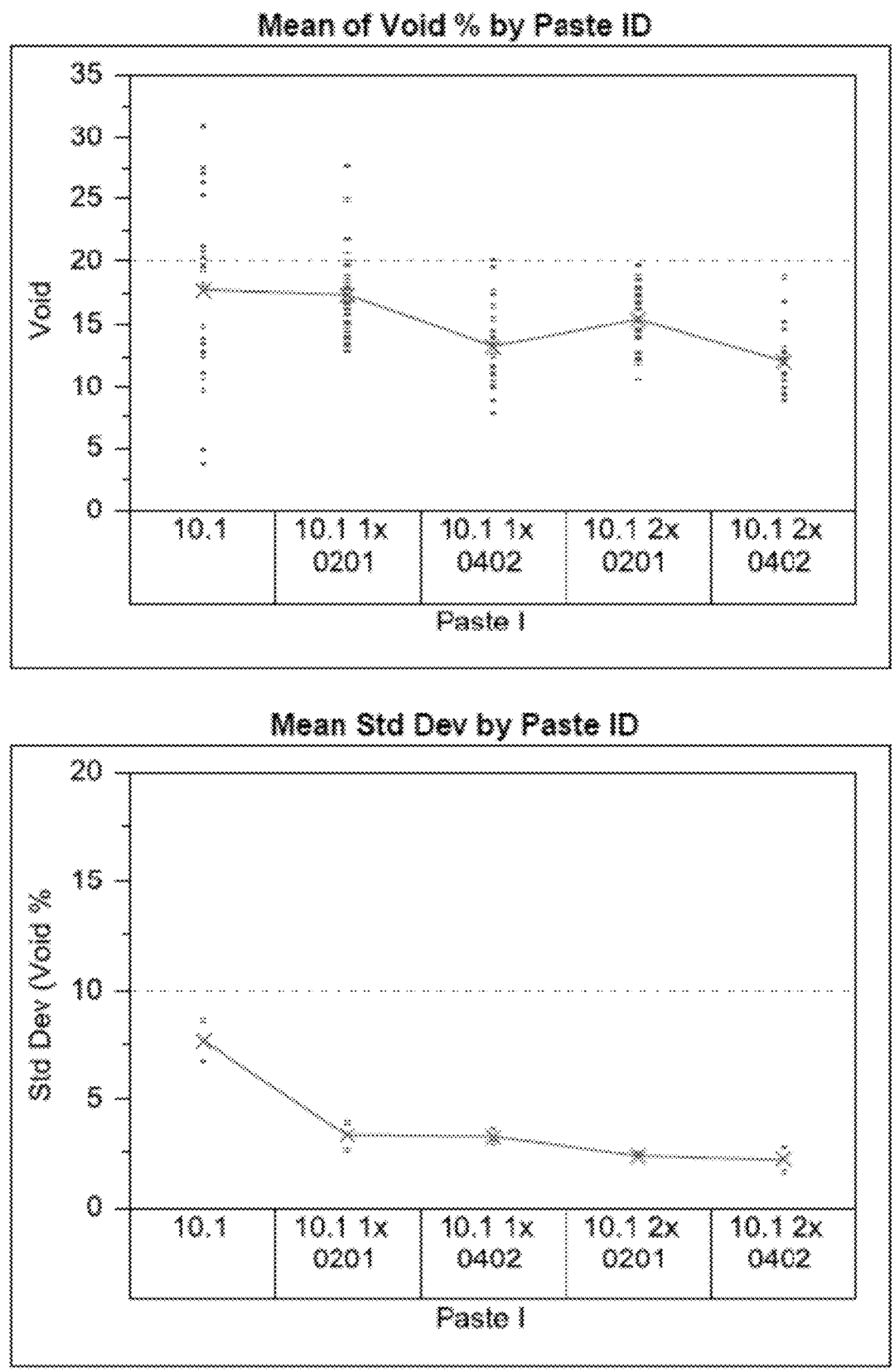
FIG. 11 is a diagram illustrating the mean of the void percentage for the data sets of FIG. 5 (upper chart) and the mean and standard deviation for the data sets (lower chart).

FIG. 10 is a diagram illustrating the variability of the void percentage for the sample sets (upper chart) and the standard deviation in the data points (lower chart). FIG. 11 is a diagram illustrating the mean of the void percentage for the data sets (upper chart) and the mean and standard deviation for the data sets (lower chart). As these charts in FIGS. 10 and 11 illustrate, the results tend to be more consistent, and therefore more predictable using preforms embedded in the solder paste.

Figure 12:
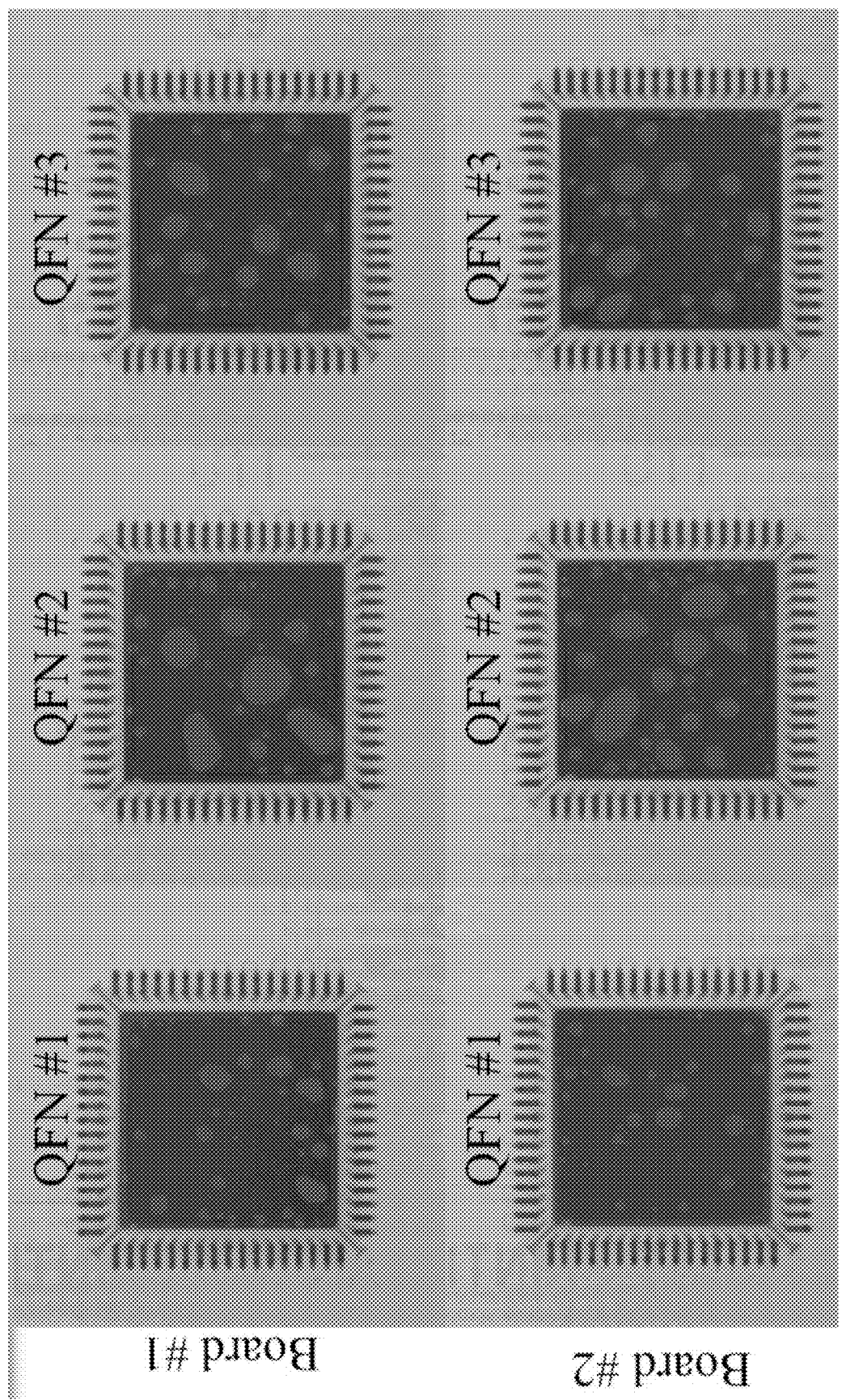
FIG. 12 is a diagram providing X-ray images of solder voids in the solder joints for three different components on both boards using only the solder paste of FIG. 5 without any preforms.
Figure 13:
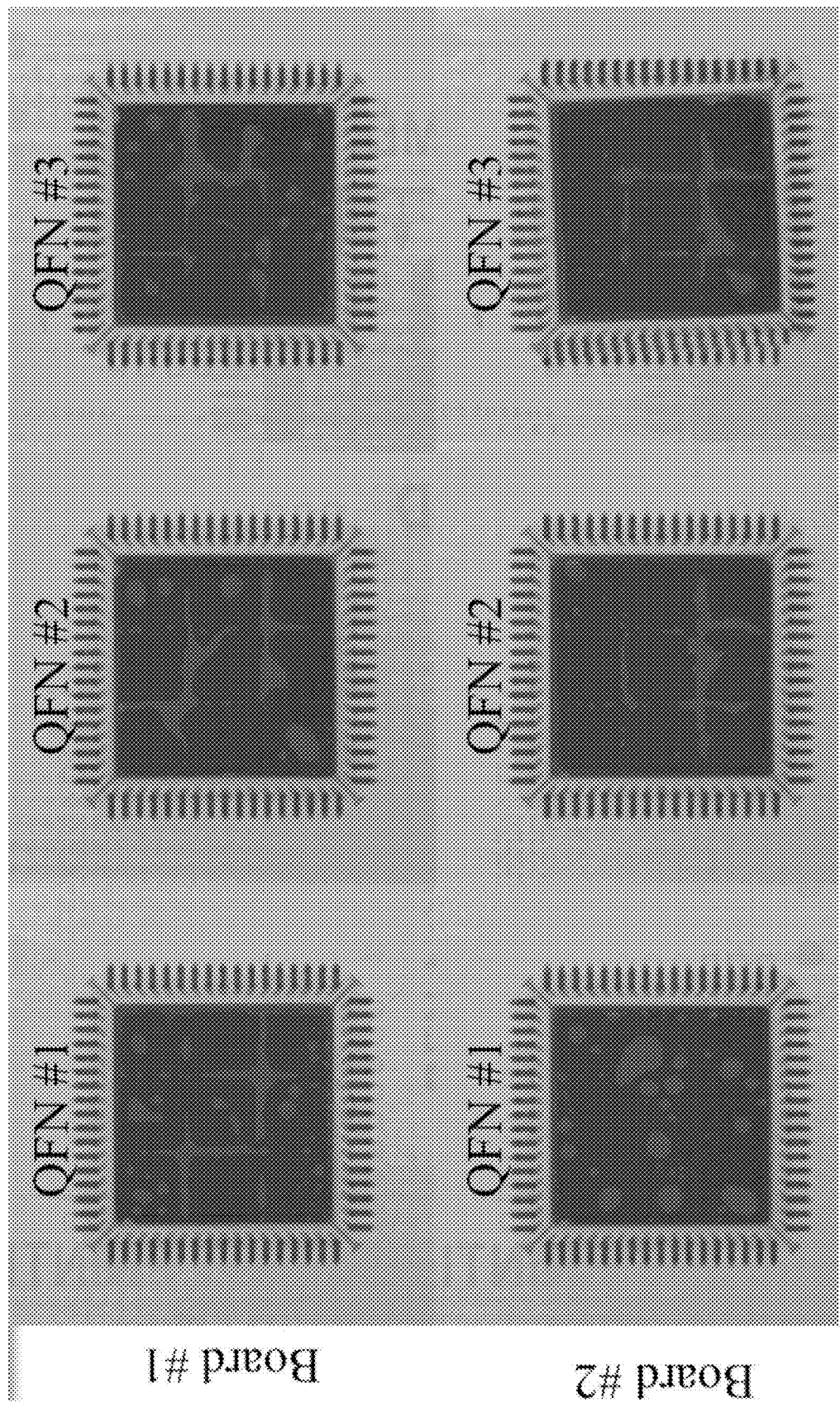
FIG. 13 is a diagram providing Scanning Electron Microscope (SEM) images for the same three components on the same two boards, but using a 0201 preform embedded in the solder paste of FIG. 5.

FIG. 12 is a diagram providing X-ray images of solder voids in the solder joints for three different components on both boards using only indium 10.1 solder paste without any preforms. FIG. 13 is a diagram illustrating SEM images for the same three components on the same two boards but this time including a 0201 preform embedded in the 10.1 solder paste. As seen by comparison to FIG. 12, while voids still do remain, they generally appear to account for a smaller percentage of the area of the solder joint.

Figure 14:
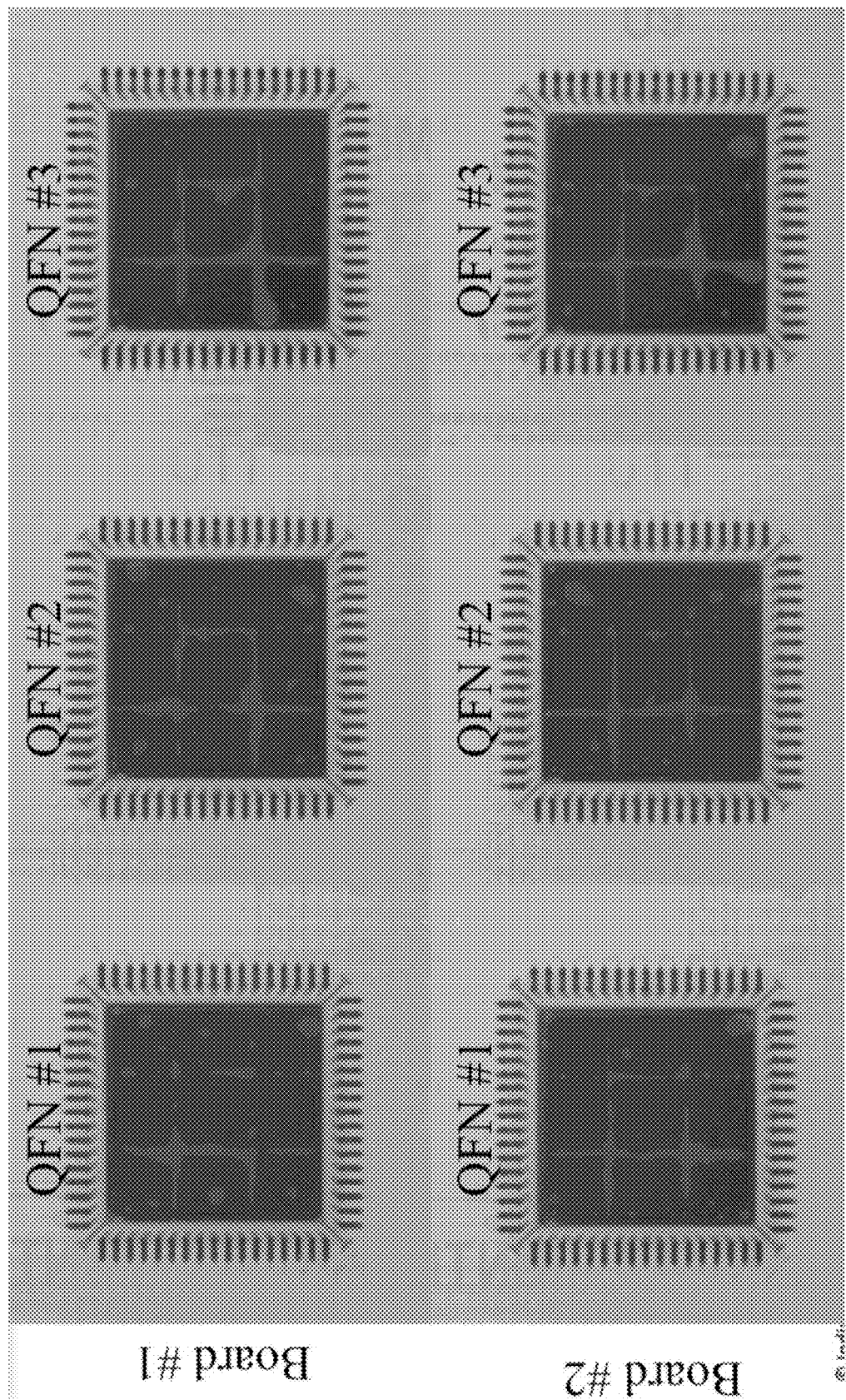
FIG. 14 is a diagram providing SEM images for the same three components on the same two boards, but using two 0201 preforms embedded in the solder paste of FIG. 5.

FIG. 14 is a diagram providing SEM images of the same components and boards, but using two 0201 preforms embedded in the 10.1 solder paste. As these images illustrate, the voiding percentage appears to be even less.

Figure 15:
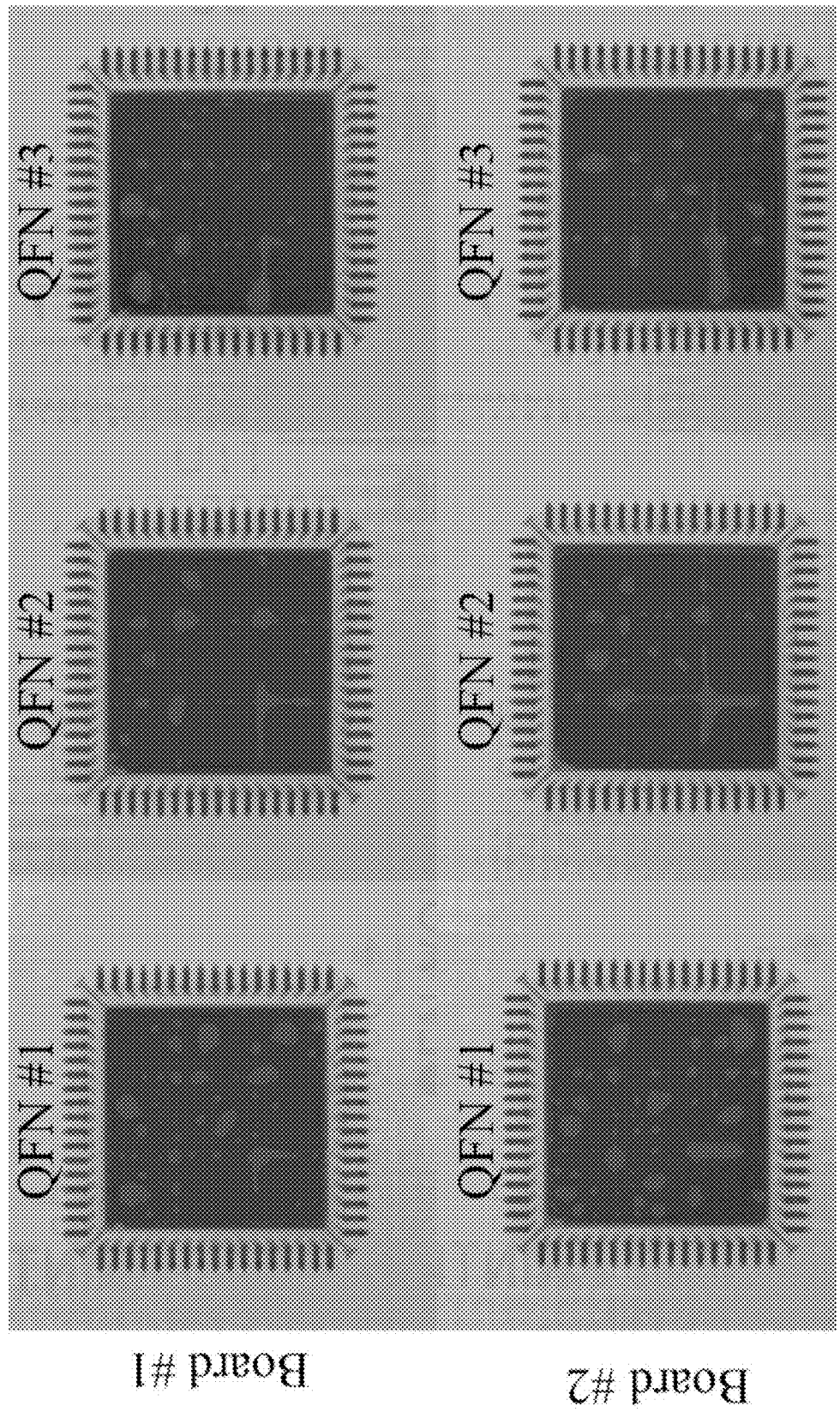
FIG. 15 is a diagram providing SEM images for the same three components on the same two boards, but using one 0402 solder preform embedded in the solder paste of FIG. 5.
Figure 16:
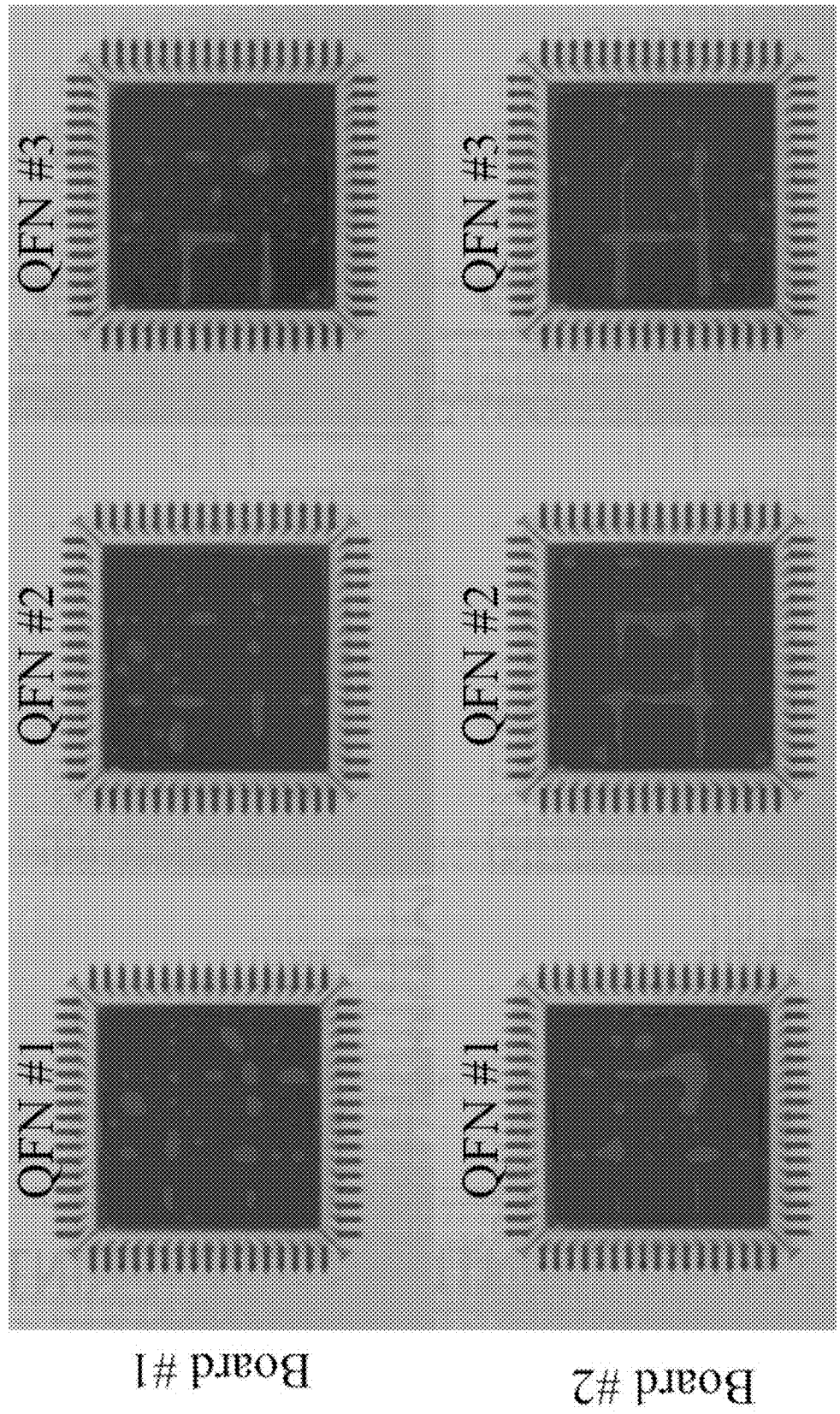
FIG. 16 is a diagram providing SEM images for the same three components on the same two boards, but using two 0402 solder preforms embedded in the solder paste of FIG. 5.

FIG. 15 is a diagram providing SEM images of solder joints for the same components and boards, but using one 0402 solder preform. FIG. 16 is a diagram providing SEM images but with two 0402 solder preforms.

As noted above, these tests revealed that skewing of parts was only found on builds using one preform. The tests also revealed that the voiding decreased as the preform size increased (e.g. from a 0201 to a 0402 preform). Similarly, the voiding decreased when multiple preforms were used, and the predictability or consistency of the results improved.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for solder reflow, comprising:
 receiving a printed circuit board comprising a plurality of contact pads;
 depositing a volume of solder paste onto each of the plurality of contact pads, wherein each of the deposited volumes of solder paste comprises flux;
 depositing one or more solder preforms into each volume of solder paste such that each of the one or more solder preforms is fully embedded in each volume of solder paste, wherein each of the one or more solder preforms has the same or a higher melting temperature than the solder paste;
 placing electronic components onto the printed circuit board such that contacts of the electronic components are aligned with corresponding contact pads of the printed circuit board;
 reflow soldering the electronic components to the printed circuit board, wherein during reflow soldering, the one or more solder preforms maintains a gap between the component and a top surface of the solder paste such that as the solder paste begins to melt, at least some gasses created as a byproduct of the solder paste melting escape in the gap from between the contacts, wherein during reflow soldering a profile of the solder paste is reduced more quickly than is a height of the one or more preforms due to presence of the flux in the solder paste, thereby forming the gap.

2. The method of claim 1, wherein reflow soldering the electronic components to the printed circuit board comprises positioning the board and electronic components in a high temperature environment to melt the solder paste and the one or more solder preforms, thereby wetting the contacts and soldering the components to the board.

3. The method of claim 1, wherein the one or more solder preforms includes at least two solder preforms deposited in each volume of solder paste.

4. The method of claim 1, wherein the one or more solder preforms includes at least four solder preforms deposited in each volume of solder paste.

5. The method of claim 1, wherein the height of each of the one or more solder preforms is identical or substantially identical to the height of each volume of solder paste.

6. The method of claim 1, wherein the one or more solder preforms comprises a 0201 or 0402 preform.

7. The method of claim 1, wherein the electronic components comprise a bottom termination component semiconductor package.

8. The method of claim 7, wherein the bottom termination component semiconductor package is a Quad Flat No-leads package (QFN).

9. An electronic assembly formed by the process of:
 receiving a printed circuit board comprising a plurality of contact pads;
 depositing a volume of solder paste onto each of the plurality of contact pads, wherein each of the deposited volumes of solder paste comprises flux;
 depositing one or more solder preforms into each volume of solder paste such that each of the one or more solder preforms is fully embedded in each volume of solder paste, wherein each of the one or more solder preforms has the same or a higher melting temperature than the solder paste;
 placing electronic components onto the printed circuit board such that contacts of the electronic components are aligned with corresponding contact pads of the printed circuit board;
 reflow soldering the electronic components to the printed circuit board to form the electronic assembly, wherein during reflow soldering, the one or more solder preforms maintains a gap between the component and a top surface of the solder paste such that as the solder paste begins to melt, at least some gasses created as a byproduct of the solder paste melting escape in the gap from between the contacts, wherein during reflow soldering a profile of the solder paste is reduced more quickly than is a height of the one or more preforms due to the presence of the flux in the solder paste, thereby forming the gap.

10. The electronic assembly of claim 9, wherein reflow soldering the electronic components to the printed circuit board comprises positioning the board and electronic components in a high temperature environment to melt the solder paste and the one or more solder preforms, thereby wetting the contacts and soldering the components to the board.

11. The electronic assembly of claim 9, wherein the one or more solder preforms includes at least two solder preforms deposited in each volume of solder paste.

12. The electronic assembly of claim 9, wherein the one or more solder preforms includes at least four solder preforms deposited in each volume of solder paste.

13. The electronic assembly of claim 9, wherein the height of each of the one or more solder preforms is identical or substantially identical to the height of each volume of solder paste.

14. The electronic assembly of claim 9, wherein the one or more solder preforms comprises a 0201 or 0402 preform.

15. The electronic assembly of claim 9, wherein the electronic components comprise a bottom termination component semiconductor package.

16. The electronic assembly of claim 15, wherein the bottom termination component semiconductor package is a Quad Flat No-leads package (QFN).

17. The method of claim 1, wherein, after reflow soldering, a voiding percentage of each solder joint formed between the contacts of the electronic components and the corresponding contact pads of the printed circuit board is less than 20%.

18. The electronic assembly of claim 9, wherein after reflow soldering, a voiding percentage of each solder joint formed between the contact pads of the electronic components and the corresponding contacts of the printed circuit board is less than 20%.

* * * * *